(12) United States Patent
Agam et al.

(10) Patent No.: US 10,497,780 B2
(45) Date of Patent: Dec. 3, 2019

(54) CIRCUIT AND AN ELECTRONIC DEVICE INCLUDING A TRANSISTOR AND A COMPONENT AND A PROCESS OF FORMING THE SAME

(71) Applicant: SEMICONDUCTOR COMPONENTS INDUSTRIES, LLC, Phoenix, AZ (US)

(72) Inventors: Moshe Agam, Portland, OR (US); Agajan Suwhanov, Happy Valley, OR (US); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/965,236

(22) Filed: Apr. 27, 2018

(65) Prior Publication Data
US 2019/0333992 A1    Oct. 31, 2019

(51) Int. Cl.
| H01L 29/08 | (2006.01) |
| H01L 21/762 | (2006.01) |
| H01L 27/06 | (2006.01) |
| H01L 29/06 | (2006.01) |
| H01L 29/417 | (2006.01) |

(52) U.S. Cl.
CPC .... H01L 29/0821 (2013.01); H01L 21/76224 (2013.01); H01L 21/76264 (2013.01); H01L 27/0623 (2013.01); H01L 29/0649 (2013.01); H01L 29/41708 (2013.01)

(58) Field of Classification Search
CPC ........... H01L 21/76224; H01L 29/0821; H01L 21/76264

USPC .......................................................... 257/565
See application file for complete search history.

(56) References Cited

U.S. PATENT DOCUMENTS

| 5,825,600 A * | 10/1998 | Watt ..................... H01L 27/0251 361/56 |
| 7,871,882 B2 | 1/2011 | Parthasarathy et al. |
| 8,674,480 B2 | 3/2014 | Chiu et al. |
| 8,809,156 B1 | 8/2014 | Allen et al. |
| 9,748,330 B2 | 8/2017 | Janssens |
| 9,882,375 B2 * | 1/2018 | Van Wijmeersch ... H02H 9/046 |

(Continued)

OTHER PUBLICATIONS

U.S. Appl. No. 15/497,443, filed Apr. 26, 2017, Inventors: Moshe Agam et al., specification pp. 1-36, drawings sheets 1-8.

*Primary Examiner* — Igwe U Anya
(74) *Attorney, Agent, or Firm* — Abel Schillinger, LLP

(57) ABSTRACT

In an aspect, a circuit can include a first transistor, wherein an emitter is coupled to an emitter terminal, and a base is coupled to a base terminal; a second transistor, wherein the collector is coupled to a substrate terminal, and a base is coupled to the collector of the first transistor; and a component having a rectifying junction, wherein a first terminal is coupled to the collector of the first transistor, and a second terminal is coupled to the collector terminal of the circuit. In another aspect, an electronic device can include a substrate having a first semiconductor region; a second semiconductor region; and a third semiconductor region; a first trench isolation structure extending from a major surface through the third semiconductor region and terminating within the second semiconductor region; and an emitter region coupled to an emitter terminal of the electronic device.

20 Claims, 8 Drawing Sheets

(56) References Cited

U.S. PATENT DOCUMENTS

| | | | |
|---|---|---|---|
| 2006/0261876 A1* | 11/2006 | Agarwal | H01L 21/8213 327/427 |
| 2009/0154041 A1* | 6/2009 | Nakahara | H03K 17/063 361/84 |
| 2011/0279152 A1* | 11/2011 | Nakahara | H01L 27/0623 327/110 |
| 2014/0268451 A1* | 9/2014 | Van Wijmeersch | H01L 27/0262 361/56 |
| 2018/0033784 A1* | 2/2018 | Appaswamy | H01L 29/7408 |

* cited by examiner

CIRCUIT AND AN ELECTRONIC DEVICE INCLUDING A TRANSISTOR AND A COMPONENT AND A PROCESS OF FORMING THE SAME

FIELD OF THE DISCLOSURE

The present disclosure relates to circuit, electronic devices, and processes of forming electronic devices, and more particularly to, circuits and electronic devices including a transistor and a component and processes of forming the same.

RELATED ART

Integrated circuits have been classified as analog devices, digital devices, or power devices. Smart Power technologies combine or integrate analog and digital circuits with power devices on or within a single semiconductor substrate. The smart part of a smart power circuit adds, for example, control, diagnostic, and protection functions to the power semiconductor devices. Smart Power technologies have increased the robustness and reliability of power drivers for automotive and industrial applications. Such applications have included, for example, intelligent power switches for controlling an anti-lock braking system, system power chips for airbag control, engine management, motor control, switched mode power supplies, intelligent switching of lights, among others.

The integration of logic and analog functions with power transistors on a single die presents challenges in the isolation schemes used to physically separate and electrically isolate the different functional devices. Such isolation schemes have included, for example, junction isolation and dielectric isolation schemes. Dielectric isolation schemes have included dielectric trench isolation, which separates components in a lateral direction, but not against the substrate, as well as semiconductor-on-insulator ("SOI") schemes that provide both lateral isolation and vertical substrate isolation. Another isolation scheme has combined dielectric trench isolation with junction isolation regions that have been disposed adjoining the trench isolation regions within the active regions of the device.

However, the above noted isolation schemes have several shortcomings. For example, junction isolation schemes include doped regions that consume lateral space within the die, which results in larger die sizes being used to ensure sufficient lateral spacing to sustain breakdown characteristics. Also, because of the larger area taken up by junction isolation schemes, junction isolation schemes also tend to exhibit undesirable high capacitance. SOI technologies provide for reduced chips sizes, but have had issues with thermal dissipation, high on-resistance due to larger average junction temperature, less robustness during inductive clamping, and lower energy capability during an electrostatic discharge ("ESD") event, among others. In addition, in high voltage SOI technology, the parasitic capacitance per unit area of the top layer towards the underlying substrate often exceeds the capacitance per unit area presented by vertical junction isolation. Additionally, SOI technologies are expensive to manufacture.

Accordingly, improved isolation structures and methods of forming semiconductor devices using the isolation structures are desired.

BRIEF DESCRIPTION OF THE DRAWINGS

Embodiments are illustrated by way of example and are not limited in the accompanying figures.

Figure 1:
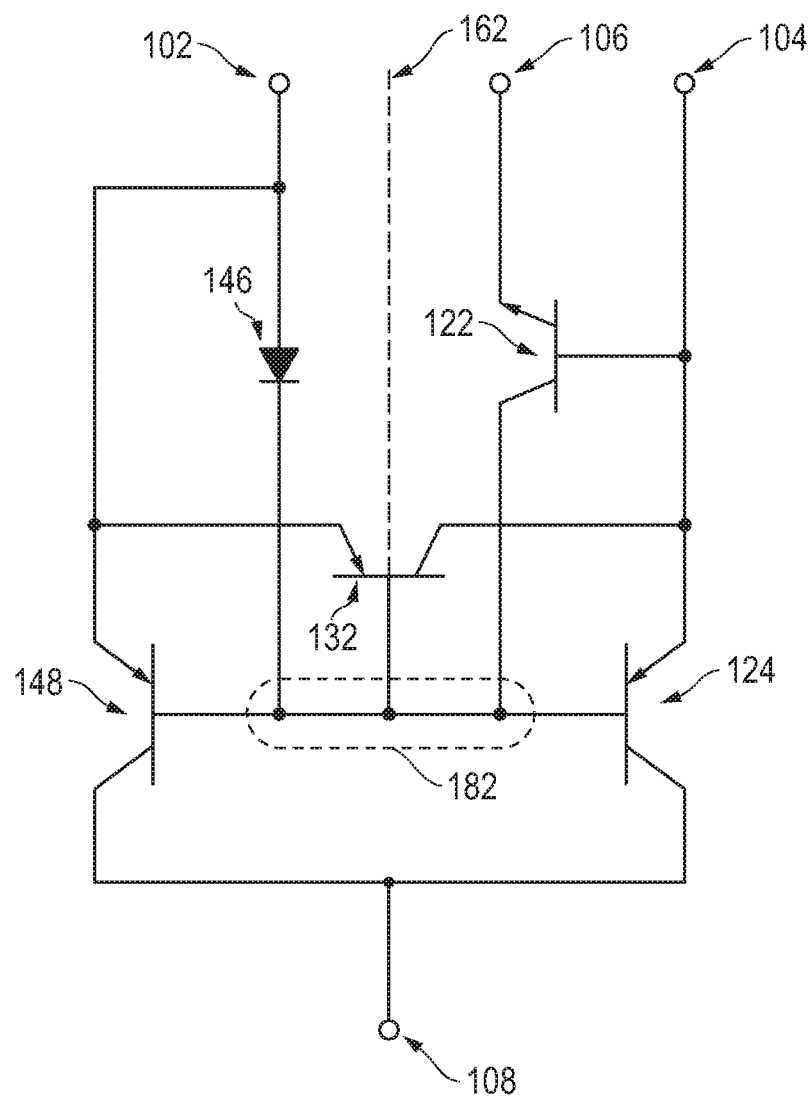
FIG. 1 includes schematic diagram of a circuit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The term "heavily doped" with respect to a semiconductor region or layer is intended to that such region or layer has a dopant concentration of at least $4 \times 10^{18}$ atoms/cm$^3$.

The term "power transistor" is intended to mean a transistor that is designed to normally operate with at least a 50 V difference maintained between the source and drain of the transistor or emitter and collector of the transistor when the transistor is in an off-state. For example, when the transistor is in an off-state, a 50 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In an aspect, a circuit can include an emitter terminal, a base terminal, a collector terminal, and a substrate terminal; a first transistor including an emitter, a base, and a collector, wherein the emitter of the first transistor is coupled to the emitter terminal, and the base of the first transistor is coupled to the base terminal; a second transistor including an emitter, a base, and a collector, wherein the collector of the second transistor is coupled to the substrate terminal, and the base is coupled to the collector of the first transistor; and a component having a rectifying junction, a first terminal, and a second terminal, wherein the first terminal is coupled to the collector of the first transistor, and the second terminal is coupled to the collector terminal of the circuit.

In another aspect, an electronic device can include an emitter terminal, a first base terminal, and a collector terminal; and a substrate having first and second opposing major surfaces. The substrate can include a first semiconductor region having a first conductivity type; a second semiconductor region having a second conductivity type opposite the first conductivity type; and a third semiconductor region having the first conductivity type, wherein the second semiconductor region is disposed between the first and third semiconductor regions. The electronic device can also include a trench isolation structure extending from the major surface through the third semiconductor region and terminating within the second semiconductor region, wherein the trench isolation structure has first and second opposing sides, each of the second and third semiconductor regions has a first portion lying along the first side of the trench isolation structure, each of the second and third semiconductor regions has a second portion lying along the second side of the trench isolation structure, the first portion of the third semiconductor region is coupled to the first base terminal of the electronic device, and the second portion of the third semiconductor region is coupled to the collector terminal of the electronic device. The electronic device can further include an emitter region having the second conductivity type, wherein the emitter region lies closer to the major surface than to the second semiconductor region, overlies the first portion of the second semiconductor region, and is coupled to the emitter terminal of the electronic device.

In a further aspect, a process of forming an electronic device can include providing a substrate having a major surface and including a first semiconductor region having a first conductivity type; a second semiconductor region having a second conductivity type opposite the first conductivity type; and a third semiconductor region having the first conductivity type, wherein the second semiconductor region is disposed between the first and third semiconductor regions. The process can further include forming a trench isolation structure extending from the major surface through the third semiconductor region and terminating within the second semiconductor region, wherein the trench isolation structure has first and second opposing sides, each of the second and third semiconductor regions has a first portion lying along the first side of the trench isolation structure, each of the second and third semiconductor regions has a second portion lying along the second side of the trench isolation structure. The process can also include forming a first doped region within or overlying the first portion of the third semiconductor region, and forming a second doped region within or overlying the second portion of the third semiconductor region. The process can still further include forming an emitter region having the second conductivity type, wherein the emitter region lies closer to the major surface than to the second semiconductor region and overlies the first portion of the second semiconductor region; and forming an emitter terminal, a base terminal, and a collector terminal, wherein the emitter region is coupled to the emitter terminal, the first portion of the third semiconductor region is coupled to the base terminal, and the second portion of the third semiconductor region is coupled to the collector terminal.

The circuits and electronic devices as described and illustrated herein can allow for a relatively smaller area to be occupied while still allowing for high voltage circuits to operate properly. A medium trench isolation structure can help direct current and maintain relatively high electrical fields between different components in the circuit, and a deep trench isolation structure can help isolate components operating at relatively higher voltages from other components that operate at relatively lower voltages. Furthermore, the physical structures for the circuit can be integrated into a process flow that is used to form IGFETs that can control the operation of the high voltage portions of the circuit.

FIG. 1 includes a depiction of circuit 100 in accordance with an embodiment. The circuit 100 includes a collector terminal 102, a base terminal 104, an emitter terminal 106, and a substrate terminal 108. The circuit includes transistors 122, 124, and 148, and a component, which in the illustrated embodiment is a pn junction diode 146. In the circuit 100, well over 50% current flow through the circuit is from the collector terminal 102 to the emitter terminal 106 via the component and the transistor 122. The pn junction diode 146 includes an anode coupled to the collector terminal 102 and a cathode coupled to the node 182. The transistor 122 is an NPN bipolar transistor and includes a collector that is coupled to the node 182, a base coupled to the base terminal 104, and an emitter coupled to the emitter terminal 106. The transistors 124 and 148 are parasitic transistors that have relatively low betas, and thus leakage current through the transistors 124 and 148 can be kept lower than 10% of the current through the circuit 100. The transistors 124 and 148 are PNP bipolar transistors and have their collectors coupled to the substrate terminal 108 and their bases coupled to the intermediate node 182. The emitter of the transistor 148 is coupled to the collector terminal 102, and the emitter of the transistor 124 is coupled to the base terminal 104. Dashed line 162 depicts a trench isolation structure that may be present between the transistor 122 and the component, which is the pn junction diode 146 in this embodiment. More details regarding the physical structure are described below. The trench isolation structure depicted by dashed line 162 may form a corresponding transistor 132. The transistor 132 is a PNP bipolar transistor and has its emitter coupled to the emitter of the transistor 148, its base coupled to the intermediate node 182, and its collector coupled to the emitter of the transistor 124. In another embodiment (not illustrated), the emitter and collector of the transistor 132 may be reversed, such that its emitter coupled to the emitter of the transistor 124, and its collector coupled to the emitter of the transistor 148.

Figure 2:
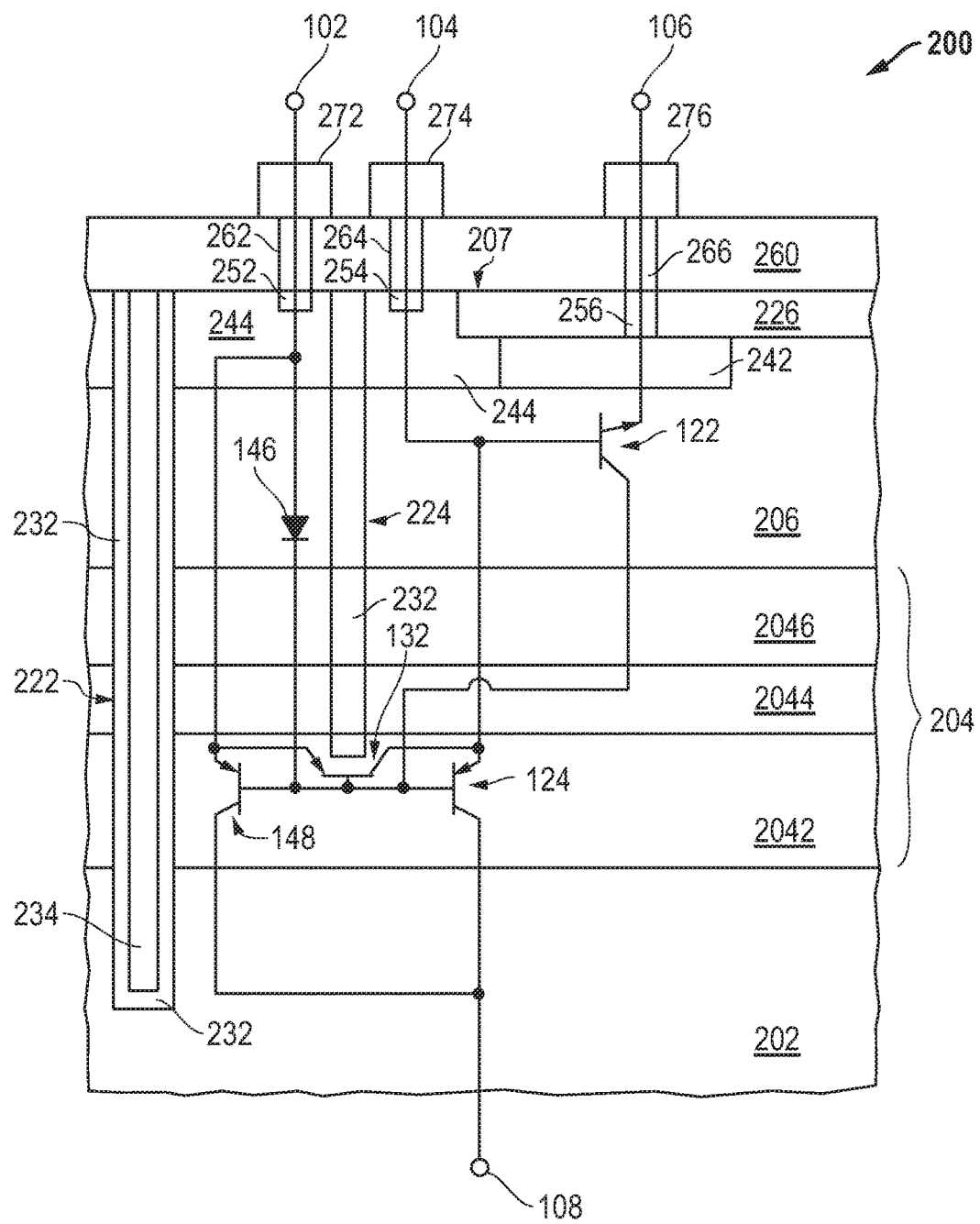
FIG. 2 includes an illustration of a cross-sectional view of a portion of a workpiece including an exemplary electronic device including the circuit of FIG. 1.

Referring to FIG. 2, the circuit 100 can be achieved in electronic device with a relatively smaller area compared to conventional devices by strategic use of different depths of field isolation structures. Deep trench isolation structure 222 can be used to electrically isolate the circuit 100 from other circuits and components of the electronic device, medium trench isolation structure 224 can be used to direct current through the component and into a semiconductor region 204 before current flows through the transistor 122, and a shallow trench isolation structure can be used to isolate connections for the base and emitter terminals 104 and 106 from each other and to isolate other components outside the circuit from one another. Components from the circuit 100 (in FIG. 1) are illustrated to aid in understanding how such components can be implemented within an electronic device.

The workpiece 200 includes semiconductor regions 202, 204, and 206. The semiconductor region 202 can be a base material or a layer overlying a base material. In an embodiment, the semiconductor region 202 can be a heavily doped semiconductor wafer. In a particular embodiment, the semiconductor region 202 is a heavily doped p-type Si wafer. In another embodiment, the semiconductor region 202 can include a plurality of p-type layers of different dopant concentration. Furthermore, the semiconductor region 202 can include other types of materials including heterojunction semiconductor materials. The semiconductor region 202 includes collector regions of the PNP transistors 124 and 148 in FIG. 1.

The semiconductor region 204 overlies and has an opposite conductivity type as compared to the semiconductor region 202. The semiconductor region 204 can be n-type doped. In accordance with an embodiment, semiconductor region 204 includes the node 182 in FIG. 1 and is configured to be electrically floating (e.g., no external connection is made to the semiconductor region 204). The semiconductor region 204 includes a collector region of the transistor 122, a cathode region of the pn junction diode 146, and base regions of the transistors 124 and 148. In an embodiment, the semiconductor region 204 can be formed by epitaxially growing the semiconductor region 202.

The semiconductor region 204 can include a plurality of regions of different dopant concentrations. In an embodiment, region 2044 can be more heavily doped as compared to the regions 2042 and 2046. The dopant concentrations within the regions 2042 and 2046 can be lower than the region 2044 to help with junction breakdown voltages between the semiconductor regions 202 and 204 and between the semiconductor regions 204 and 206.

By way of example, the region 2042 can have an average dopant concentration in a range from $1 \times 10^{15}$ atoms/cm$^3$ to $1 \times 10^{17}$ atoms/cm$^3$ and a thickness in a range from 3 microns to 5 microns, the region 2044 can have an average dopant concentration in a range from $2 \times 10^{17}$ atoms/cm$^3$ to $1.0 \times 10^{19}$ atoms/cm$^3$ and a thickness in a range from 1 micron to 3 microns, the region 2046 can have an average dopant concentration in a range from $1.0 \times 10^{15}$ atoms/cm$^3$ to $1.0 \times 10^{17}$ atoms/cm$^3$ and a thickness in a range from 3 microns to about 5 microns. The relatively higher concentration with the region 2044 helps to keep betas of the transistors 124, 148, and 132 relatively low. In addition or alternatively, the thickness of the region 2042 can be made thicker to further reduce leakage current. In an embodiment, the beta of the transistor 122 is at least an order of magnitude higher than each of the betas of the transistors 124 and 148. The relatively lower betas of the transistors 124 and 148 help to keep leakage current to an amount that is less than 10% of the current through the transistor 122 and component (the pn junction diode 146 in the embodiment illustrated).

In another embodiment, the semiconductor region 204 can have a graded dopant profile. In a further embodiment, the semiconductor region 204 can have a substantially constant dopant concentration. The dopant concentrations can be changed during epitaxially growth to form the regions 2042, 2044, and 2046. Alternatively, one or more of the regions 2042, 2044, and 2046 can be formed by doping after the semiconductor region 204 is grown. In still another embodiment, the semiconductor region 204 can be grown, and the region 2044 can be formed by ion implantation, and the regions 2042 and 2046 can be formed by diffusing dopant from the region 2044.

The semiconductor region 206 overlies and has an opposite conductivity type as compared to the semiconductor region 204. In an embodiment, the semiconductor region 206 can be p-type doped. The portions of the semiconductor region 206 can be doped and counter doped to form well regions and doped contact regions. Thus, the semiconductor region 206 is originally grown to a major surface 207. The semiconductor region 206 includes a base region of the transistor 122, an anode region of the pn junction diode, and emitter regions of the transistors 124 and 148. The thickness and dopant concentration of the semiconductor region 206 may depend on the breakdown voltage of the collector to emitter of the transistor 122, the beta of the transistor 122, another suitable parameter, or any combination thereof. In a particular embodiment, the thickness of the semiconductor region 206 can be in a range of 5 microns to 15 microns, and the average dopant concentration is in a range of $1 \times 10^{14}$ atoms/cm$^3$ to $5 \times 10^{16}$ atoms/cm$^3$.

Doped region 242 and 244 can be formed from upper portions the semiconductor region 206. The doped region 242 can be an emitter region of the transistor 122 and have an opposite conductivity type as compared to the region 206. The doped regions 242 and 244 can be formed at the same time as n-well and p-well regions within other portions of the electronic device. Such n-well and p-well regions can be at locations where IGFETs or other components are being formed. The depths of the doped regions 242 and 244 can be in a range from 1 micron to 5 microns. In an embodiment, the doped region 242 is n-type doped, and the doped region 244 is p-type doped. Each of the regions 242 and 244 can have a dopant concentration in a range of $1 \times 10^{15}$ atoms/cm$^3$ to $5 \times 10^{17}$ atoms/cm$^3$.

As illustrated in the embodiment of FIG. 2, three different types of trench isolation structures can be used to help isolate components from one another. A deep trench isolation structure 222 can be used to isolate the circuit 100 from other components of the electronic device. For example, the deep trench isolation structure 222 can be used to isolate the circuit 100 from other power components, digital logic transistors, or other components. As illustrated in FIG. 2, the deep trench isolation structure 222 extends from the major surface 207 through the doped region 244, semiconductor regions 206 and 204 and terminates within the semiconductor region 202.

A medium trench isolation structure 224 can be used to direct current flow through the portions of the well region 244 and semiconductor regions 204 and 206 to the left of the medium trench isolation region 244 before current flows through the portions of the semiconductor regions 204 and 206 and the doped region 242 to the right of the medium trench isolation region 224. The medium trench isolation region 224 can allow the component (pn junction diode 146) to be located closer to the transistor 122 without causing breakdown between the portions of the electronic device along the major surface 207. If the medium trench isolation structure 224 would not have been present, the portions of the electronic device that are electrically connected to the collector terminal 102 would have to be laterally separated from the portions of the electronic device that are electrically connected to the emitter and base terminals 104 and 106. Thus, the medium trench isolation structure 224 helps to reduce area occupied by the circuit 100.

The medium trench isolation structure 224 can result in the formation of the transistor 132 because the medium trench isolation structure 224 extends completely through the semiconductor region 206. The medium trench isolation structure 224 can extend through the region 2046 may extend partly or completely through the region 2044. When the medium trench isolation structure 224 extends completely through the region 2044, the beta of the transistor 132 can be kept relatively low; however, on-state resistance through the circuit 100 may be relatively higher than if the medium trench isolation structure 224 does not extent completely though the region 2044. Thus, there may be a tradeoff between on-state resistance of the circuit 100 and a low beta for the transistor 132.

The medium trench isolation structure 224 does not extend completely through 2042 as the portion of the semiconductor region 204 under the medium trench isolation structure 224 provides the electrical connection between the component and the transistor 122. In an embodiment, the medium trench isolation structure 224 does not extend into the region 2042. In another embodiment where reducing beta of the transistor 132 is desired, the medium trench isolation structure 224 extends only slightly into the region 2042 (e.g., no more than 20% of the thickness of the region 2042) to ensure minimum lateral resistance in the region 2042 underneath medium trench isolation structure 224 while ensuring the medium trench isolation structure 224 completely extends through the region 2044.

A shallow trench isolation region 226 can be used to keep different portions of components along the major surface 207 isolated from one another. As illustrated in FIG. 2, the shallow trench isolation 226 helps to isolate a portion of the electronic device electrically connected to the emitter terminal 104 from another portion of the electronic device electrically connected to the base terminal 106. The shallow trench isolation can also be used to separate an n-channel transistor (FIG. 3) from a p-channel transistor (FIG. 4) or other components, such as components within the smart part of a smart power circuit.

The dimensions of the trench isolation structures may depend on the normal operating voltages of the circuit 100 and other components within the electronic device, other design parameters, such as minimum feature and pitch size in accordance with design rules for the electronic device, depths of doped regions, thicknesses of semiconductor regions, resolution limits of lithography tools and etch techniques and chemistries used to define the trenches, another suitable parameter, or any combination thereof. Thus, the dimensions described herein are merely illustrative and do not limit the present invention as defined in the appended claims.

The widths of the deep and medium trench isolation structures 222 and 224 may depend on the depths of such structures. In an embodiment, width of the deep trench isolation structure 222 can be in a range from 1.5 microns to 2.0 microns when the semiconductor region 206 is in a range from 8 microns to 12 microns thick. In another embodiment, width of the medium trench isolation structure 224 can be in a range from 0.5 micron to 1.0 micron when the semiconductor region 206 is in a range from 8 microns to 12 microns thick. In a particular embodiment, width of the medium trench isolation structure 224 is in a range from 0.5 micron to 0.8 micron. The deep and medium trench isolation structures 222 and 224 can include a dielectric material 232 and may include a polycrystalline semiconductor material 234. For example, the medium trench isolation structure 224 may be relatively narrower than the deep trench isolation structure 232 and only include the dielectric material 232. The deep trench isolation structure 222 can include the dielectric material 232 in the form a dielectric liner, and a remainder of the deep trench isolation structure 222 includes the polycrystalline semiconductor material 234. In an alternative embodiment, the medium trench isolation structure 224 may include a dielectric liner and a polycrystalline semiconductor fill material, or the deep trench isolation structure 222 may include the dielectric material 232 and not include the polycrystalline semiconductor material 234.

The shallow trench isolation structures 226 can be used to separate components that have relatively smaller voltage differences between the components. The depth of the shallow trench isolation structure 226 can be in a range from 0.1 micron to 2 microns. In a particular embedment, the shallow trench isolation structure 226 has a depth in a range of 0.3 micron to 0.9 micron. In the embodiment as illustrated, the shallow trench isolation structure 226 can include the dielectric material 232.

Doped contact regions 252, 254, and 256 can be formed to allow ohmic contacts to be formed between metal-containing conductive plugs or interconnects and underlying doped regions 242 and 244. The doped contact regions 252 and 254 have the same conductivity type as the doped region 244 and a dopant concentration of at least $1\times10^{19}$ atoms/cm$^3$. The doped contact region 256 has the same conductivity type as the doped region 242 and a dopant concentration of at least $1\times10^{19}$ atoms/cm$^3$.

In an embodiment, electronic device further includes an interlevel dielectric (ILD) layer 260 over the major surface 207. The ILD layer 260 can include an oxide, a nitride, an oxynitride, or any combination thereof. The ILD layer 260 can include a single film having a substantially constant or changing composition (e.g., a high phosphorus content further from the semiconductor region 206) or a plurality of discrete films. An etch-stop film, an antireflective film, or a combination may be used within or over the ILD layer 260 to help with processing. The ILD layer 260 can be deposited to a thickness in a range of approximately 0.5 micron to approximately 2.0 microns. Portions of the ILD layer 260 are patterned to define contact openings.

A conductive layer can be formed within the contact openings and over the ILD layer 260 and etched to form conductive plugs 262, 264, and 266. The conductive plug 262 forms an ohmic contact with the doped contact region 252, the conductive plug 264 forms an ohmic contact with the doped contact region 254, and the conductive plug 266 forms an ohmic contact with the doped contact region 256.

In an embodiment, the conductive plugs 262, 264, and 266 can be formed from a conductive layer having a plurality of films. In an embodiment, a layer including a refractory metal, such as Ti, Ta, W, Co, Pt, or the like, can be deposited over the workpiece and within the contact openings. The workpiece can be annealed so that portions of the film including the refractory metal are selectively reacted with exposed silicon at the bottom of the contact openings, such as substantially monocrystalline or polycrystalline silicon, to form a metal silicide. A metal nitride film may be formed to further fill a part, but not the remainder, of the openings. The metal nitride film can act as a barrier film. A conductive material fills the remainder of the contact openings, the conductive fill material can include W. Portions of the layer including the refractory metal, the metal nitride film, and the conductive film material that overlie the ILD layer 260 are removed to form the conductive plugs 262, 264, and 266.

As illustrated in the embodiment of FIG. 2, interconnects 272, 274, and 276 overlie and are electrically connected to the conductive plugs 262, 264, and 266, respectively. The interconnects 272, 274, and 276 are formed from a conductive layer that can include one or more films. In an embodiment, the interconnects 272, 274, and 276 can include a bulk conductive film that includes mostly Al or Cu. When the conductive layer includes a plurality of films, an adhesion film or a barrier film can be deposited before the bulk conductive film. An antireflective film can be formed over the bulk conductive film and can include a metal nitride film. The conductive layer can have a thickness in a range of 0.5 micron to 3 microns. The conductive layer can be patterned to form the interconnects 272, 274, and 276.

Although not illustrated, one or more other interconnect levels and a passivation layer may be formed over the workpiece. Each interconnect level can include an interlevel dielectric layer and interconnects. A conductive layer can be used at each interconnect level. The conductive layer may be the same or different from the other conductive layers described with respect to the interconnects 272, 274, and 276. The passivation layer can be formed over the uppermost interconnect level and patterned to expose bond pads. Referring to FIGS. 1 and 2, the interconnect 272 is coupled to the collector terminal 102 of the circuit 100, the interconnect 274 is coupled to the base terminal 104 of the circuit 100, and the interconnect 276 is coupled to the emitter terminal 106 of the circuit 100.

Figure 3:
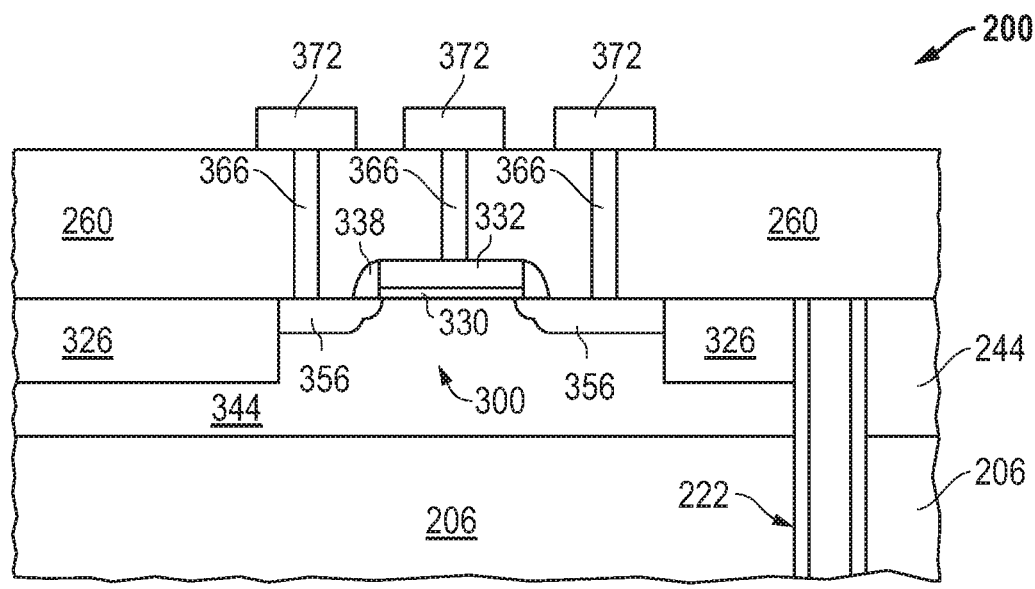
FIG. 3 includes an illustration of a cross-sectional view of another portion of the workpiece of FIG. 2, wherein the other portion includes an n-channel transistor.
Figure 4:
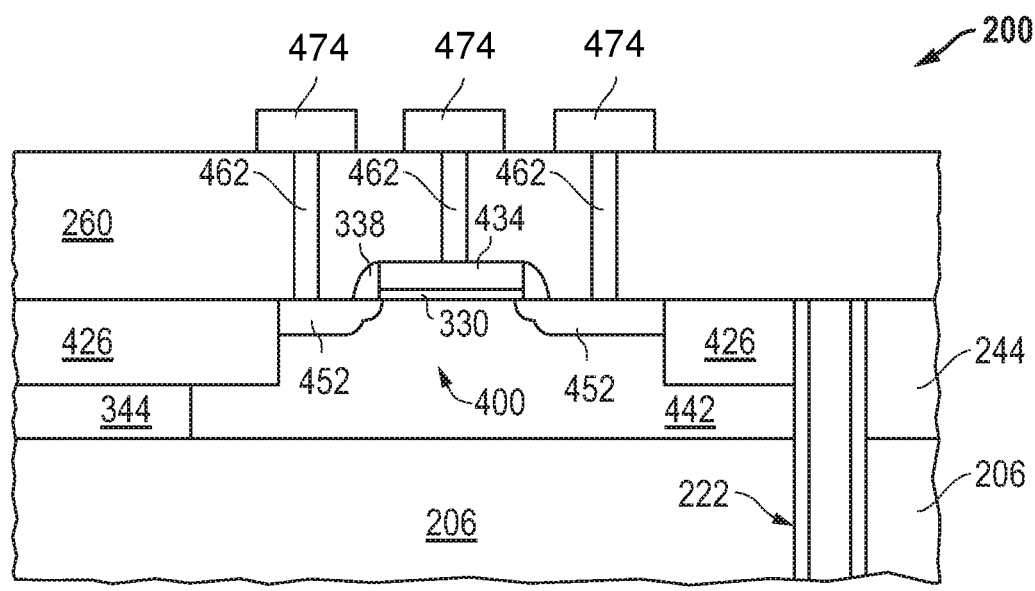
FIG. 4 includes an illustration of a cross-sectional view of a further portion of the workpiece of FIG. 2, wherein the further portion includes a p-channel transistor.

The process flow forming the physical structure in FIG. 2 that corresponds to circuit 100 is well suited for integration with a process flow used in forming field-effect transistors, and in particular, insulated gate field-effect transistors (IGFETs). FIG. 3 includes a cross-sectional view of another portion of the workpiece 200, wherein the portion includes an n-channel transistor 300. FIG. 4 includes a cross-sectional view of a further portion of the workpiece 200, wherein the portion includes a p-channel transistor 400. The IGFETs are isolated from the physical structure in FIG. 2 by the deep trench isolation structure 222. The IGFETs in FIGS. 3 and 4 may be isolated from one another by any of the trench isolation structures previously described. In a particular embodiment, the IGFETs are isolated from one another by shallow trench isolation.

FIGS. 3 and 4 include the semiconductor regions 202, 204, and 206 as previously described, although semiconductor regions 202 and 204 are not illustrated in FIGS. 3 and 4. In an embodiment, the semiconductor region 204 that underlies the transistor structures 300 and 400 electrically floats. Doped regions 344 and 442 can be formed at the same time and be substantially identical to the doped regions 244 and 242, respectively. In a particular embodiment, the doped region 344 is a p-well region in which the transistor structure 300 is formed, and the doped region 442 is an n-well region in which the transistor structure 400 is formed. Shallow trench isolation 326 and 426 can be formed at the same time and be substantially identical to the shallow trench isolation 226.

A gate dielectric layer 330 is formed over the doped regions 344 and 442 and can include one or more films of oxide, nitride, or oxynitride. The gate dielectric layer 330 has a thickness in a range of 2 nm to 15 nm in many applications. The gate dielectric layer 330 can be formed by thermal growth or deposition.

A gate electrode 332 is for the n-channel transistor, and the gate electrode 434 is for the p-channel transistor. The gate electrodes 332 and 434 are formed by depositing a conductive layer and patterning a conductive layer. The conductive layer can include a semiconductor layer that may be doped in situ or subsequently doped after the layer is deposited. In another embodiment, the conductive layer can include a metal. In still another embodiment, the conductive layer can include a lower film closer to the gate dielectric layer 330 that has a desired work function and an upper film having a different composition that is used for bulk conduction. The conductive layer can have a thickness in a range of 50 nm to 500 nm. Other thicknesses may be used if desired or needed for a particular application. The conductive layer is patterned to define the gate electrodes 332 and 434.

Referring to FIG. 3, drain/source regions 356 can be formed at the same time and be substantially identical to the doped contact region 256. Referring to FIG. 4, drain/source regions 452 can be formed at the same time and be substantially identical to the doped contact regions 252 and 254. Sidewall spacers 338 can include an insulating material and may be formed during the process sequence in forming the drain/source regions 356 and 452. After forming and patterning the ILD layer 260, conductive plugs 366 and 462 can be formed at the same time and be substantially identical to the conductive plugs 262, 264 and 266, and interconnects 372 and 474 can be formed at the same time and be substantially identical to the interconnects 272, 274, and 276. The different interconnects 372 and 474 may be connected to other parts of the electronic device.

While the structural features in FIGS. 2, 3, and 4 are described above in an order, the processing operations may or may not be performed in the order presented above. For example, the trench isolation structures 222, 224, 226, 326, and 426 may be formed before or after the doped regions 242, 244, 344, and 442. Thus, the order of formation of the regions and other features illustrated in FIGS. 2, 3, and 4 can be tailored to the needs or desires for a particular application.

Figure 5:
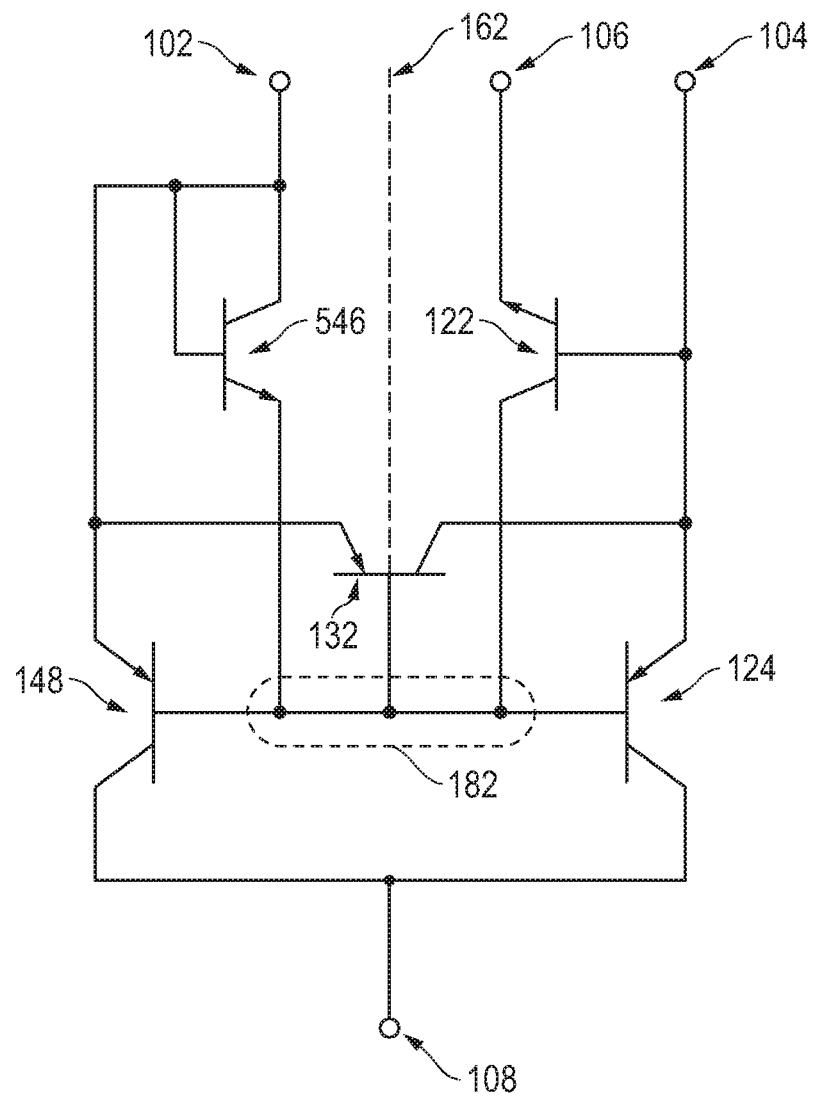
FIG. 5 includes schematic diagram of a circuit in accordance with another embodiment.

FIG. 5 includes a depiction of a schematic of another embodiment where the component within a circuit 500 includes a transistor 546 instead of the pn junction diode 146 in FIG. 1. In the embodiment illustrated, the transistor 546 is an NPN bipolar transistor. The collector and base of the transistor 546 are electrically connected to each other and are coupled to the collector terminal 102 of the circuit 500, and the emitter is coupled to the node 182. As compared to the pn junction diode 146, the transistor 546 can help reduce leakage current flowing through the transistors 148 and 132.

Figure 6:
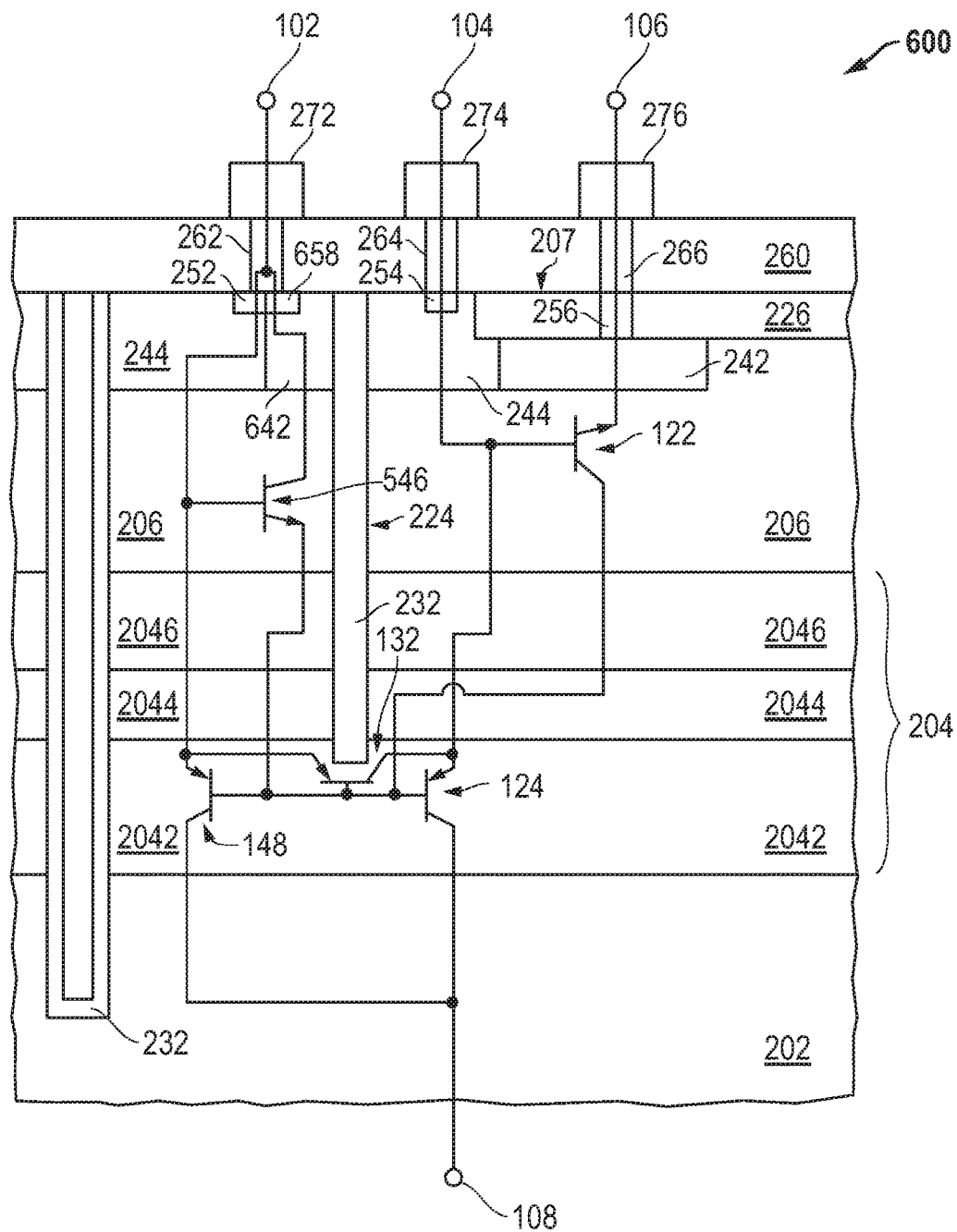
FIG. 6 includes an illustration of a cross-sectional view of a portion of a workpiece including an exemplary electronic device including the circuit of FIG. 5.

FIG. 6 includes an exemplary embodiment of a physical structure of the transistor 546. The physical structure in FIG. 6 is similar to the physical structure in FIG. 2. An additional doped region 642 and doped contact region 658 are adjacent to and have the opposite conductivity type as the doped region 244 and the doped contact region 252. In an embodiment, the additional doped region 642 can be formed at the same time and have substantially the same dopant concentration as the doped region 242, and additional doped contact region 658 can be formed at the same time and have substantially the same dopant concentration as the doped contact region 256.

Figure 7:
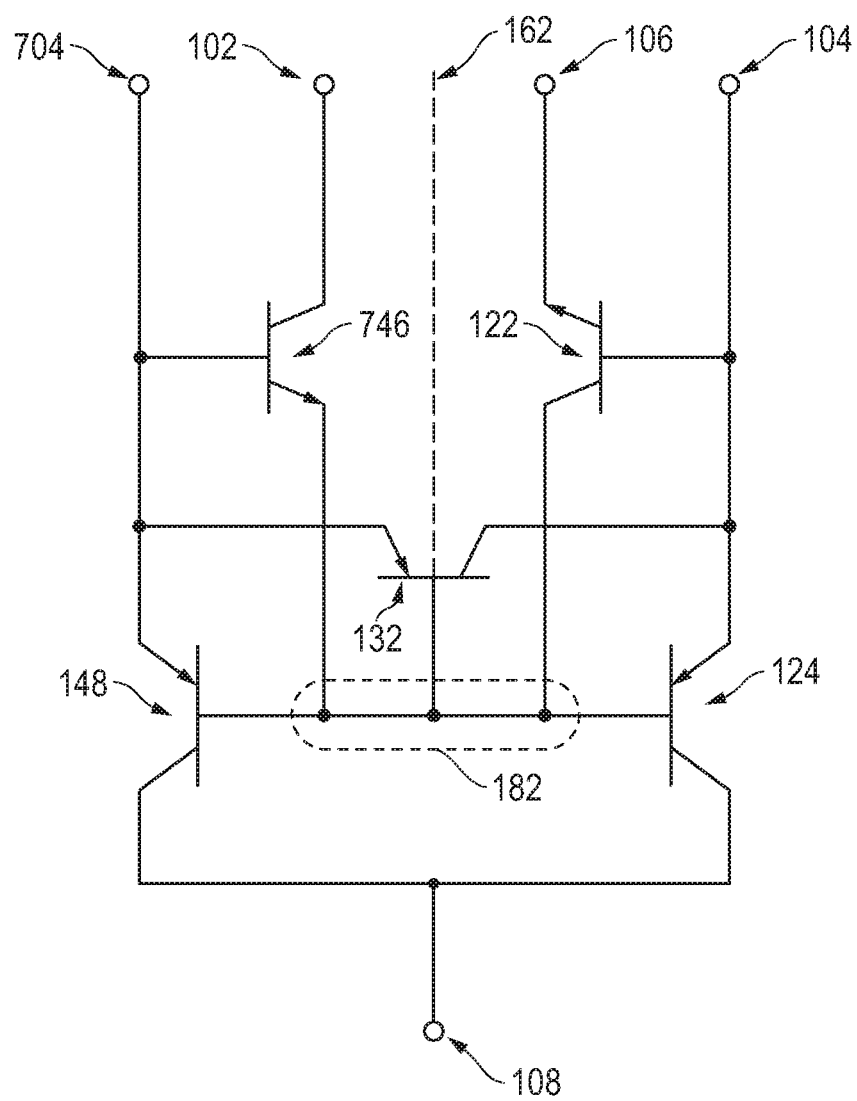
FIG. 7 includes schematic diagram of a circuit in accordance with a further embodiment.

FIG. 7 includes a depiction of a schematic of a further embodiment where the component within a circuit 700 includes a transistor 746 instead of the transistor 546 in FIG. 5. In the embodiment illustrated, the transistor 746 is an NPN bipolar transistor. Unlike the circuit 500 in FIG. 5, the circuit 700 in FIG. 7 has separate connections for the collector and base. The collector of the transistor 746 is coupled to the collector terminal 102, the base is coupled to another base terminal 704, and the emitter is coupled to the node 182. The configuration can allow the circuit 700 to normally operate at approximately double the voltage as circuit 100 and 500. For example, if each of the transistors 122 and 746 has a collector-to-emitter breakdown voltage of 90 V, the circuit 700 can operate with a 180 V difference between the collector terminal 102 and the emitter terminal 106.

Figure 8:
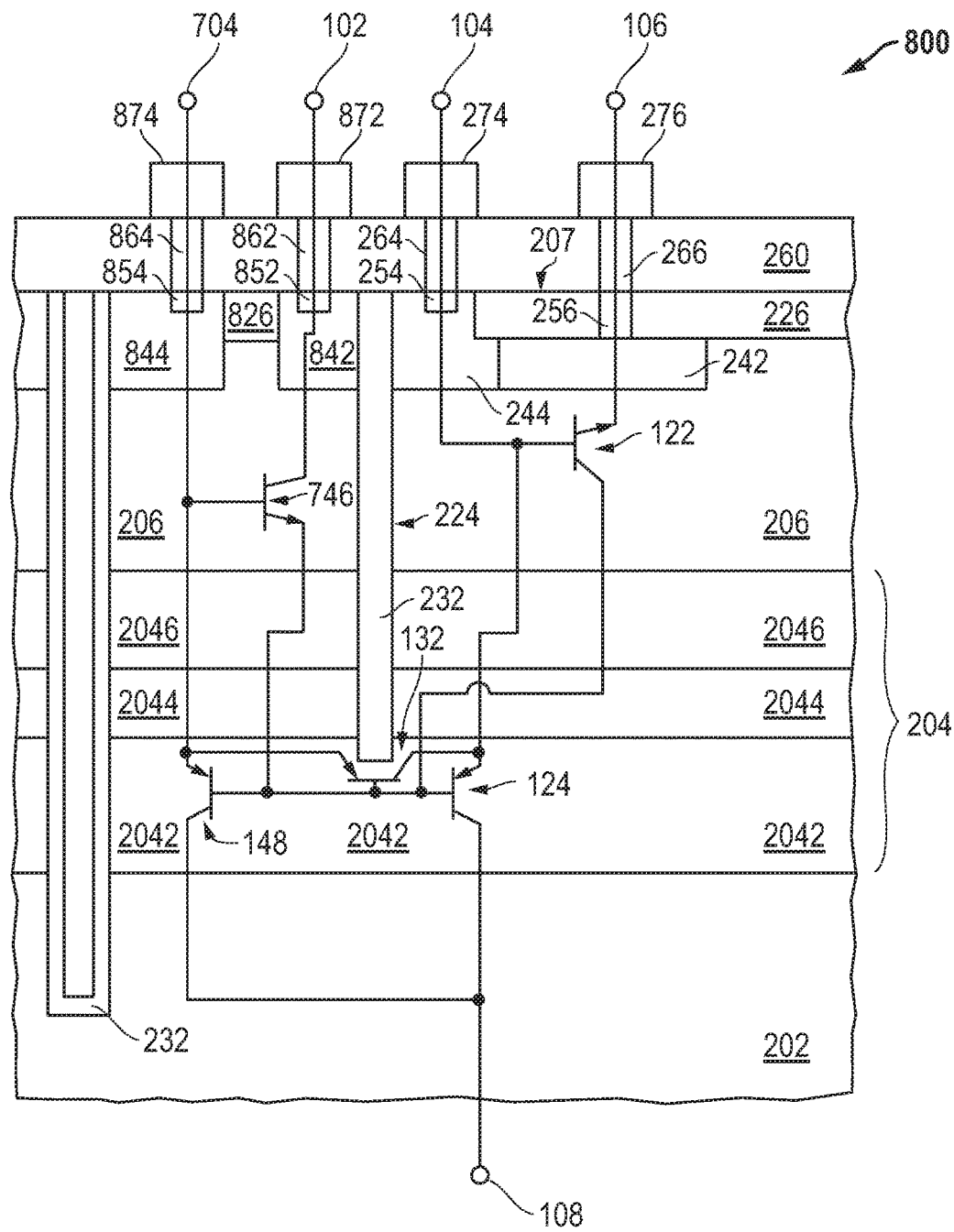
FIG. 8 includes an illustration of a cross-sectional view of a portion of a workpiece including an exemplary electronic device including the circuit of FIG. 7.

FIG. 8 includes an exemplary embodiment of a physical structure of the transistor 746. The physical structure in FIG. 8 is similar to the physical structure in FIG. 6. Doped regions 842 and 844 are formed within the semiconductor region 206 and are separated from each other by a shallow trench isolation structure 826. The doped region 842 can be formed at the same time and have substantially the same dopant concentration as the doped region 242, and the doped region 844 can be formed at the same time and have substantially the same dopant concentration as the doped region 244. The shallow trench isolation structure 826 can be formed using the same materials and process sequence used to form the shallow trench isolation 226.

Doped contact regions 852 and 854 are formed within portions of the doped regions 842 and 844, respectively. The doped contact region 852 can be formed at the same time and have substantially the same dopant concentration as the doped contact region 256, and the doped contact region 854 can be formed at the same time and have substantially the same dopant concentration as the doped contact region 254. Conductive plugs 862 and 864 extend through the ILD layer 260 and make ohmic contact with the doped contact regions 852 and 854, respectively. The conductive plugs 862 and 864 can be formed using the same materials and process sequence used to form the conductive plugs 264 and 266. Interconnects 872 and 874 overlie and contact the conductive plugs 862 and 864, respectively. The interconnects 872 and 874 can be formed using the same materials and process sequence used to form the interconnects 274 and 276. In the finished device, the interconnect 872 is coupled to the collector terminal 201, and the interconnect 874 is coupled to the other base terminal 704.

Figure 9:
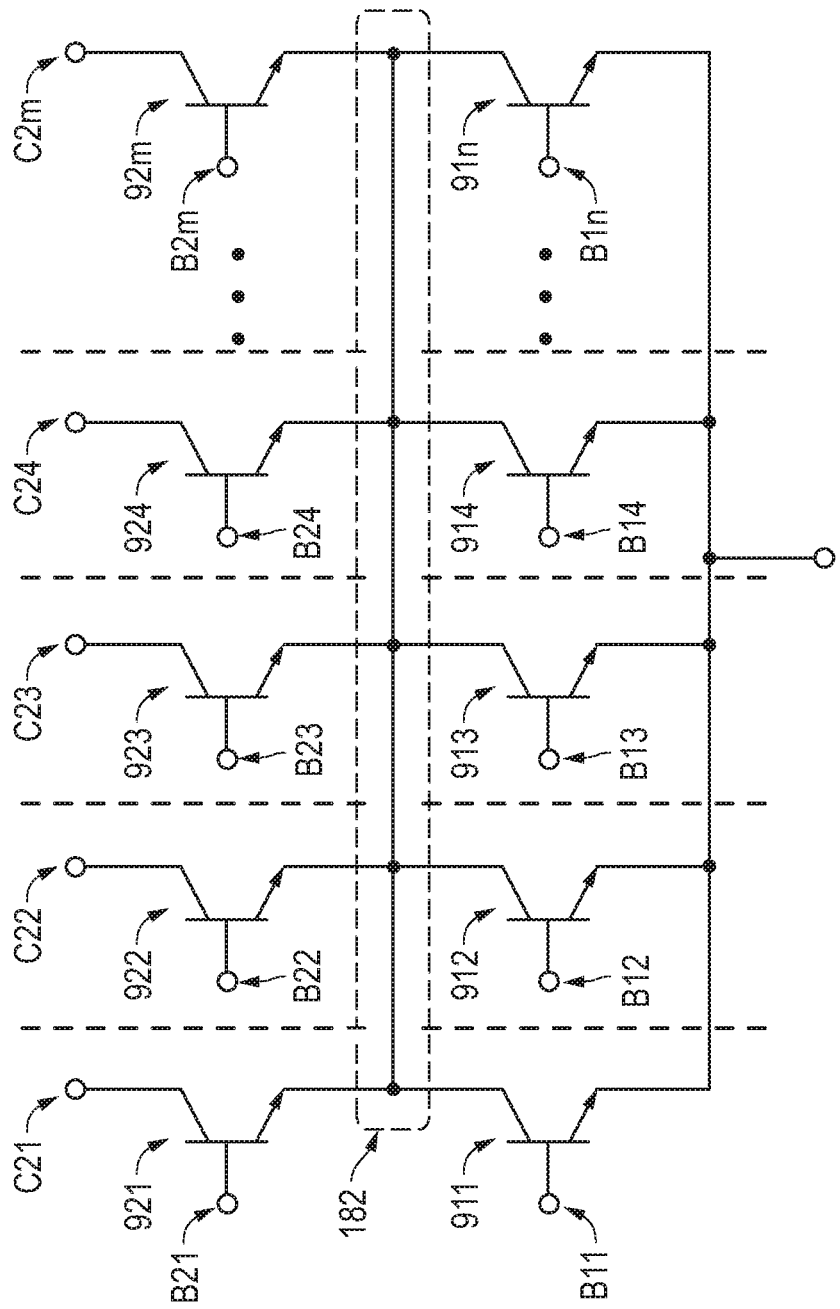
FIG. 9 includes schematic diagram of a circuit in accordance with still another embodiment.

FIG. 9 includes a circuit 900 that is a variant of circuit 700. Either or both of the transistors 122 and 746 can be replaced by a plurality of low-side transistors 911 to 91n, isolated from one another by medium trench isolation structures (indicated by the dashed lines), and high-side transistors 921 to 92m, isolated from one another by medium trench isolation structures (indicated by the dashed lines). The values for m (in 91m) and n (in 91n) may be the same or different. The transistors in FIG. 9 are NPN transistors. Although not illustrated, PNP transistor similar to the PNP transistors 124 and 148 may still be present. The circuit 900 allows for collector terminals C21 to C2m to be coupled to the collectors of the high-side transistors 946. The bases B11 to B1n and B21 to B2m for the transistors can be independently controlled and may be coupled to NAND or NOR control logic (not illustrated in FIG. 9) to allow current to flow though particular transistors or all of the transistors in FIG. 9. The vertical dashed lines in FIG. 9 indicate that medium trench isolation 224 (FIG. 2) lies between the different transistors. In the embodiment as illustrated, the dashed vertical lines are to note the medium trench isolation 224 extends into but not completely through the semiconductor region 204. In another embodiment, the medium trench isolation 224 can extend to any of the depths as previously described.

The circuits and electronic devices as described and illustrated herein can allow for relatively smaller area to be occupied while still allowing for high voltage circuits to operate properly. Strategic positioning of a medium trench isolation structure can help direct current and maintain relatively high electrical fields between different components in the circuit. Furthermore, the physical structures for the circuit can be integrated into a process flow that is used to form IGFETs that can control the operation of the high voltage portions of the circuit.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

A circuit can include:
an emitter terminal, a first base terminal, a collector terminal, and a substrate terminal;
a first transistor including an emitter, a base, and a collector, wherein the emitter of the first transistor is coupled to the emitter terminal, and the base of the first transistor is coupled to the first base terminal;
a second transistor including an emitter, a base, and a collector, wherein the collector of the second transistor is coupled to the substrate terminal, and the base is coupled to the collector of the first transistor; and
a component having a rectifying junction, a first terminal, and a second terminal, wherein the first terminal is coupled to the collector of the first transistor, and the second terminal is coupled to the collector terminal of the circuit.

Embodiment 2

The circuit of Embodiment 1, wherein the component is a pn junction diode having an anode and a cathode, wherein the first terminal of the component is the cathode of the pn junction diode, and the second terminal of the component is the anode of the pn junction diode.

Embodiment 3

The circuit of Embodiment 1, wherein the component is a third transistor including an emitter, a base, and a collector, wherein the first terminal of the component is the emitter of the third transistor, the second terminal of the component is the collector of the third transistor, and the base of the third transistor is coupled to the collector of the third transistor.

Embodiment 4

The circuit of Embodiment 1, further comprising a second base terminal, wherein the component is a third transistor including an emitter, a base, and a collector, wherein the first terminal of the component is the emitter of the third transistor, the second terminal of the component is the collector of the third transistor, and the base of the third transistor is coupled to the second base terminal.

Embodiment 5

The circuit of Embodiment 1, further comprising a third transistor having an emitter, a collector, and a base, wherein the emitter is connected to the collector terminal of the circuit, the base of the third transistor is coupled to the base of the second transistor, the collector of the third transistor is coupled to the substrate terminal of the circuit, and the emitter of the second transistor is coupled to the first base terminal of the circuit.

Embodiment 6

The circuit of Embodiment 1, wherein a beta of the first transistor is at least an order of magnitude higher than a beta of the second transistor.

Embodiment 7

An electronic device can include:
an emitter terminal, a first base terminal, and a collector terminal;
a substrate having first and second opposing major surfaces and including:
 a first semiconductor region having a first conductivity type;
 a second semiconductor region having a second conductivity type opposite the first conductivity type; and
 a third semiconductor region having the first conductivity type, wherein the second semiconductor region is disposed between the first and third semiconductor regions;
a first trench isolation structure extending from the major surface through the third semiconductor region and terminating within the second semiconductor region, wherein:
 the first trench isolation structure has first and second opposing sides,
 each of the second and third semiconductor regions has a first portion lying along the first side of the first trench isolation structure,
 each of the second and third semiconductor regions has a second portion lying along the second side of the trench isolation structure,
 a first doped region within or overlying the first portion of the third semiconductor region is coupled to the first base terminal of the electronic device;
 a second doped region within or overlying the second portion of the third semiconductor region is coupled to the collector terminal of the electronic device; and
 an emitter region having the second conductivity type, wherein the emitter region lies closer to the major surface than to the second semiconductor region, overlies the first portion of the second semiconductor region, and is coupled to the emitter terminal of the electronic device.

Embodiment 8

The electronic device of Embodiment 7, wherein the first doped region has the first conductivity type, lies closer to the major surface than to the second semiconductor region, and overlies the first portion of the second semiconductor region.

Embodiment 9

The electronic device of Embodiment 8, wherein the second doped region has the first conductivity type, lies closer to the major surface than to the second semiconductor region, and overlies the second portion of the second semiconductor region.

Embodiment 10

The electronic device of Embodiment 8, wherein a first transistor includes the emitter region, the first portion of the third semiconductor region, and the first portion of the second semiconductor region.

Embodiment 11

The electronic device of Embodiment 10, wherein the first portion of the second semiconductor region includes the collector of the first transistor.

Embodiment 12

The electronic device of Embodiment 10, wherein a component of the electronic device includes a first region and a second region, wherein the second portion of the second semiconductor region includes the first region of the component, and the second portion of the third semiconductor region includes the second region of the component.

Embodiment 13

The electronic device of Embodiment 12, wherein the first portion of the second semiconductor layer includes a collector region of the first transistor, the second portion of the second semiconductor layer includes the first terminal of the component, and the collector region of the first transistor and the first region of the component are electrically connected to each other in the second semiconductor region.

Embodiment 14

The electronic device of Embodiment 13, wherein the component is a pn junction diode having an anode region and a cathode region, wherein the second portion of the second semiconductor layer includes the cathode region of the pn junction diode, and the second portion of the third semiconductor layer includes the anode region of the pn junction diode.

Embodiment 15

The electronic device of Embodiment 13, wherein:
the component is a second transistor having an emitter region, a base region and a collector region,
the second portion of the second semiconductor layer includes the emitter region of the second transistor,
the second portion of the third semiconductor layer includes the base region of the second transistor,
the collector region of the second transistor has the second conductivity type, lies closer to the major surface than to the second semiconductor region, and overlies the second portion of the second semiconductor region, and
the collector and base regions of the second transistor are coupled to the collector terminal of the electronic device.

Embodiment 16

The electronic device of Embodiment 13, further comprising a second base terminal, wherein:
the component is a second transistor having an emitter region, a base region and a collector region,
the second portion of the second semiconductor layer includes the emitter region of the second transistor,
the second portion of the third semiconductor layer includes the base region of the second transistor and is coupled to the second base terminal of the electronic device, and
the collector region of the second transistor has the second conductivity type and is coupled to the collector terminal of the electronic device.

Embodiment 17

The electronic device of Embodiment 13, further comprising a substrate terminal coupled to the first semiconductor region, wherein the first semiconductor region includes a collector region of a second transistor, the first portion of the second semiconductor region includes a base region of the second transistor, and the first portion of the third semiconductor region includes an emitter region of the second transistor.

Embodiment 18

The electronic device of Embodiment 13, wherein the second semiconductor region electrically floats.

Embodiment 19

The electronic device of Embodiment 18, further comprising:
a second trench isolation structure extending from the major surface through the second and third semiconductor regions and terminating within the first semiconductor region, wherein:
the second trench isolation structure has first and second opposing sides,
the second portion of the third semiconductor region lies along the first side of the second trench isolation region, and
the third semiconductor region has a third portion lying along the second side of the second trench isolation structure; and
an insulated gate field-effect transistor having a portion lying within the third portion of the third semiconductor region.

Embodiment 20

A process of forming an electronic device can include:
providing a substrate having a major surface and including:
a first semiconductor region having a first conductivity type;
a second semiconductor region having a second conductivity type opposite the first conductivity type; and
a third semiconductor region having the first conductivity type, wherein the second semiconductor region is disposed between the first and third semiconductor regions;
forming a trench isolation structure extending from the major surface through the third semiconductor region and terminating within the second semiconductor region, wherein:
the trench isolation structure has first and second opposing sides,
each of the second and third semiconductor regions has a first portion lying along the first side of the trench isolation structure,
each of the second and third semiconductor regions has a second portion lying along the second side of the trench isolation structure,
forming a first doped region within or overlying the first portion of the third semiconductor region;
forming a second doped region within or overlying the second portion of the third semiconductor region; and
forming an emitter region having the second conductivity type, wherein the emitter region lies closer to the major surface than to the second semiconductor region and overlies the first portion of the second semiconductor region; and
forming an emitter terminal, a base terminal, and a collector terminal, wherein:
the emitter region is coupled to the emitter terminal,
the first doped region is coupled to the base terminal, and
the second doped region is coupled to the collector terminal.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A circuit comprising:
an emitter terminal, a first base terminal, a collector terminal, and a substrate terminal;
a first transistor including an emitter, a base, and a collector, wherein the emitter of the first transistor is coupled to the emitter terminal, and the base of the first transistor is coupled to the first base terminal;
a second transistor including an emitter, a base, and a collector, wherein the collector of the second transistor is coupled to the substrate terminal, and the base is coupled to the collector of the first transistor; and
a component having a rectifying junction, a first terminal, and a second terminal, wherein the first terminal is coupled to the collector of the first transistor, and the second terminal is coupled to the collector terminal of the circuit.

2. The circuit of claim 1, wherein the component is a pn junction diode having an anode and a cathode, wherein the first terminal of the component is the cathode of the pn junction diode, and the second terminal of the component is the anode of the pn junction diode.

3. The circuit of claim 1, wherein the component is a third transistor including an emitter, a base, and a collector, wherein the first terminal of the component is the emitter of the third transistor, the second terminal of the component is the collector of the third transistor, and the base of the third transistor is coupled to the collector of the third transistor.

4. The circuit of claim 1, further comprising a second base terminal, wherein the component is a third transistor including an emitter, a base, and a collector, wherein the first terminal of the component is the emitter of the third transistor, the second terminal of the component is the collector of the third transistor, and the base of the third transistor is coupled to the second base terminal.

5. The circuit of claim 1, further comprising a third transistor having an emitter, a collector, and a base, wherein:
the emitter is connected to the collector terminal of the circuit,
the base of the third transistor is coupled to the base of the second transistor,
the collector of the third transistor is coupled to the substrate terminal of the circuit, and
the emitter of the second transistor is coupled to the first base terminal of the circuit.

6. The circuit of claim 1, wherein a beta of the first transistor is at least an order of magnitude higher than a beta of the second transistor.

7. An electronic device comprising:
an emitter terminal, a first base terminal, and a collector terminal;
a substrate having first and second opposing major surfaces and including:
a first semiconductor region having a first conductivity type;
a second semiconductor region having a second conductivity type opposite the first conductivity type; and
a third semiconductor region having the first conductivity type, wherein the second semiconductor region is disposed between the first and third semiconductor regions;
a first trench isolation structure extending from the major surface through the third semiconductor region and terminating within the second semiconductor region, wherein:
the first trench isolation structure has first and second opposing sides,
each of the second and third semiconductor regions has a first portion lying along the first side of the first trench isolation structure, and
each of the second and third semiconductor regions has a second portion lying along the second side of the trench isolation structure,
a first doped region within or overlying the first portion of the third semiconductor region is coupled to the first base terminal of the electronic device;
a second doped region within or overlying the second portion of the third semiconductor region is coupled to the collector terminal of the electronic device; and
an emitter region having the second conductivity type, wherein the emitter region lies closer to the major surface than to the second semiconductor region, overlies the first portion of the second semiconductor region, and is coupled to the emitter terminal of the electronic device.

8. The electronic device of claim 7, wherein the first doped region has the first conductivity type, lies closer to the major surface than to the second semiconductor region, and overlies the first portion of the second semiconductor region.

9. The electronic device of claim 8, wherein the second doped region has the first conductivity type, lies closer to the major surface than to the second semiconductor region, and overlies the second portion of the second semiconductor region.

10. The electronic device of claim 8, wherein a first transistor includes the emitter region, the first portion of the third semiconductor region, and the first portion of the second semiconductor region.

11. The electronic device of claim 10, wherein the first portion of the second semiconductor region includes the collector of the first transistor.

12. The electronic device of claim 10, wherein a component of the electronic device includes a first region and a second region, wherein the second portion of the second semiconductor region includes the first region of the component, and the second portion of the third semiconductor region includes the second region of the component.

13. The electronic device of claim 12, wherein:
the first portion of the second semiconductor layer includes a collector region of the first transistor,
the second portion of the second semiconductor layer includes the first terminal of the component, and
the collector region of the first transistor and the first region of the component are electrically connected to each other in the second semiconductor region.

14. The electronic device of claim 13, wherein the component is a pn junction diode having an anode region and a cathode region, wherein:
the second portion of the second semiconductor layer includes the cathode region of the pn junction diode, and
the second portion of the third semiconductor layer includes the anode region of the pn junction diode.

15. The electronic device of claim 13, wherein:
the component is a second transistor having an emitter region, a base region and a collector region,
the second portion of the second semiconductor layer includes the emitter region of the second transistor,
the second portion of the third semiconductor layer includes the base region of the second transistor,
the collector region of the second transistor has the second conductivity type, lies closer to the major surface than to the second semiconductor region, and overlies the second portion of the second semiconductor region, and
the collector and base regions of the second transistor are coupled to the collector terminal of the electronic device.

16. The electronic device of claim 13, further comprising a second base terminal, wherein:
the component is a second transistor having an emitter region, a base region and a collector region,
the second portion of the second semiconductor layer includes the emitter region of the second transistor,
the second portion of the third semiconductor layer includes the base region of the second transistor and is coupled to the second base terminal of the electronic device, and
the collector region of the second transistor has the second conductivity type and is coupled to the collector terminal of the electronic device.

17. The electronic device of claim 13, further comprising a substrate terminal coupled to the first semiconductor region, wherein:
the first semiconductor region includes a collector region of a second transistor,
the first portion of the second semiconductor region includes a base region of the second transistor, and
the first portion of the third semiconductor region includes an emitter region of the second transistor.

18. The electronic device of claim 13, wherein the second semiconductor region electrically floats.

19. The electronic device of claim 18, further comprising:
a second trench isolation structure extending from the major surface through the second and third semiconductor regions and terminating within the first semiconductor region, wherein:
the second trench isolation structure has first and second opposing sides,
the second portion of the third semiconductor region lies along the first side of the second trench isolation region, and
the third semiconductor region has a third portion lying along the second side of the second trench isolation structure; and
an insulated gate field-effect transistor having a portion lying within the third portion of the third semiconductor region.

20. A process of forming an electronic device comprising:
providing a substrate having a major surface and including:
a first semiconductor region having a first conductivity type;
a second semiconductor region having a second conductivity type opposite the first conductivity type; and
a third semiconductor region having the first conductivity type, wherein the second semiconductor region is disposed between the first and third semiconductor regions;
forming a trench isolation structure extending from the major surface through the third semiconductor region and terminating within the second semiconductor region, wherein:
the trench isolation structure has first and second opposing sides,
each of the second and third semiconductor regions has a first portion lying along the first side of the trench isolation structure,
each of the second and third semiconductor regions has a second portion lying along the second side of the trench isolation structure,
forming a first doped region within or overlying the first portion of the third semiconductor region;
forming a second doped region within or overlying the second portion of the third semiconductor region; and
forming an emitter region having the second conductivity type, wherein the emitter region lies closer to the major surface than to the second semiconductor region and overlies the first portion of the second semiconductor region; and
forming an emitter terminal, a base terminal, and a collector terminal, wherein:
the emitter region is coupled to the emitter terminal,
the first doped region is coupled to the base terminal, and
the second doped region is coupled to the collector terminal.

\* \* \* \* \*